United States Patent [19]

Nishi

[11] Patent Number: 5,682,243

[45] Date of Patent: Oct. 28, 1997

[54] METHOD OF ALIGNING A SUBSTRATE

[75] Inventor: Kenji Nishi, Kanagawa-ken, Japan

[73] Assignee: Nikon Corporation, Tokyo, Japan

[21] Appl. No.: 517,853

[22] Filed: Aug. 22, 1995

[30] Foreign Application Priority Data

Aug. 22, 1994 [JP] Japan .................................. 6-196558

[51] Int. Cl.$^6$ .................................................. G01B 11/00
[52] U.S. Cl. ............................................................ 356/401
[58] Field of Search ................................ 356/399–401; 250/559.3, 548; 355/43, 53

[56] References Cited

U.S. PATENT DOCUMENTS

| 4,655,598 | 4/1987 | Murakami et al. |
| 4,780,617 | 10/1988 | Umatate et al. |
| 5,418,613 | 5/1995 | Matsutani ............................ 356/401 |

FOREIGN PATENT DOCUMENTS 62-171125   7/1987   Japan.

*Primary Examiner*—K. Hantis

*Attorney, Agent, or Firm*—Armstrong, Westerman, Hattori, McLeland & Naughton

[57] ABSTRACT

A method of aligning a substrate with a predetermined reference position is disclosed. An alignment system for detecting an alignment mark formed on a substrate has a detection center. In advance of actual alignment operations, each of a plurality of different types of reference marks is positioned at the detection center, the reference marks are successively detected by means of the alignment system, and detection offset values associated with each reference mark are obtained based on the results of the detection. In an actual alignment operation, one of the reference marks that is of the type substantially the same as that of the alignment mark is determined. Then the position to which the substrate is to be moved is controlled based on i) the detection offset values corresponding to said one reference mark determined and ii) the results of the detection of the alignment mark by means of the alignment system. According to this method, the alignment mark can be detected with accuracy and the substrate can be precisely aligned with the predetermined reference position for any mark type of the alignment mark formed on the substrate.

17 Claims, 7 Drawing Sheets

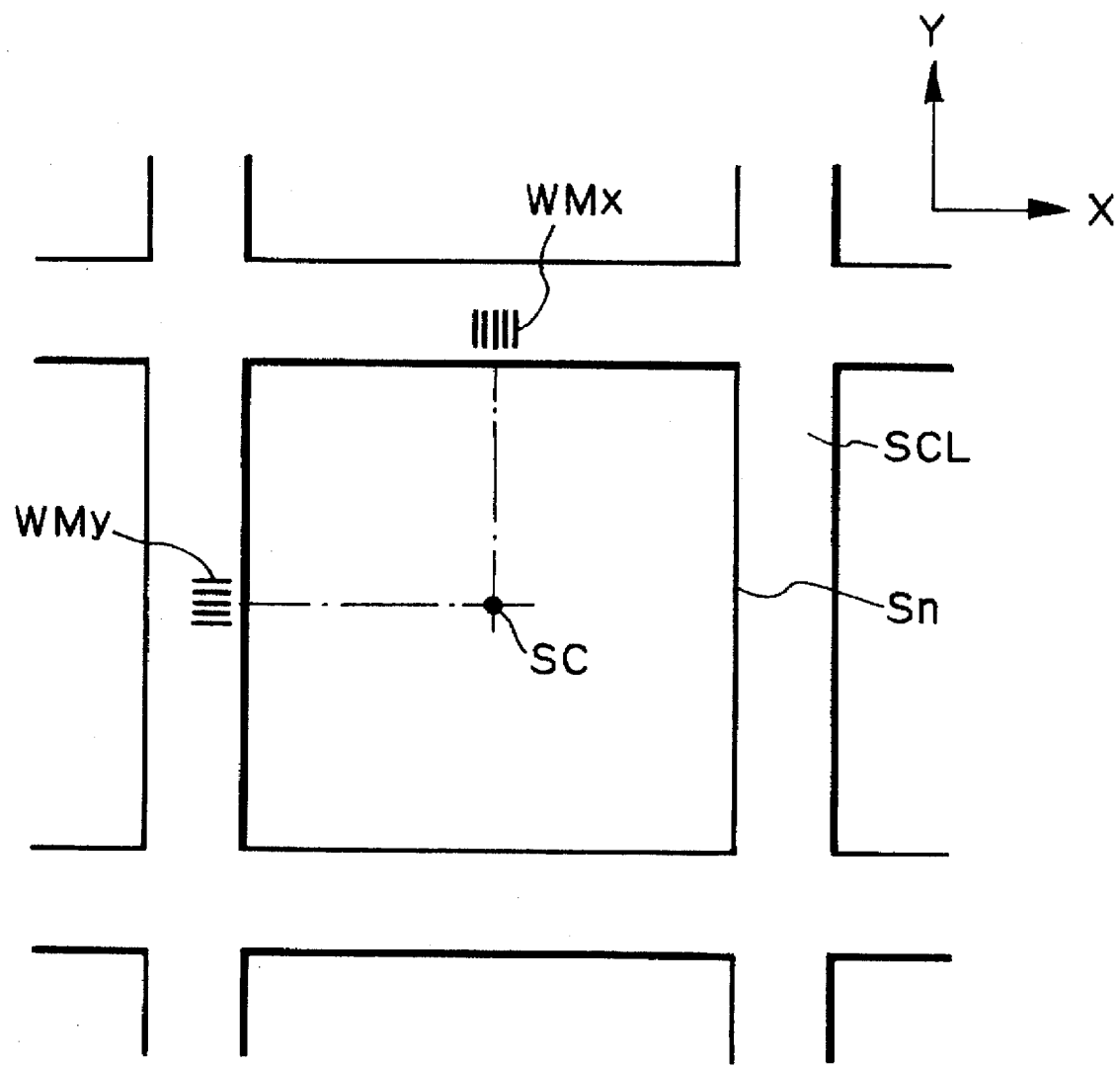

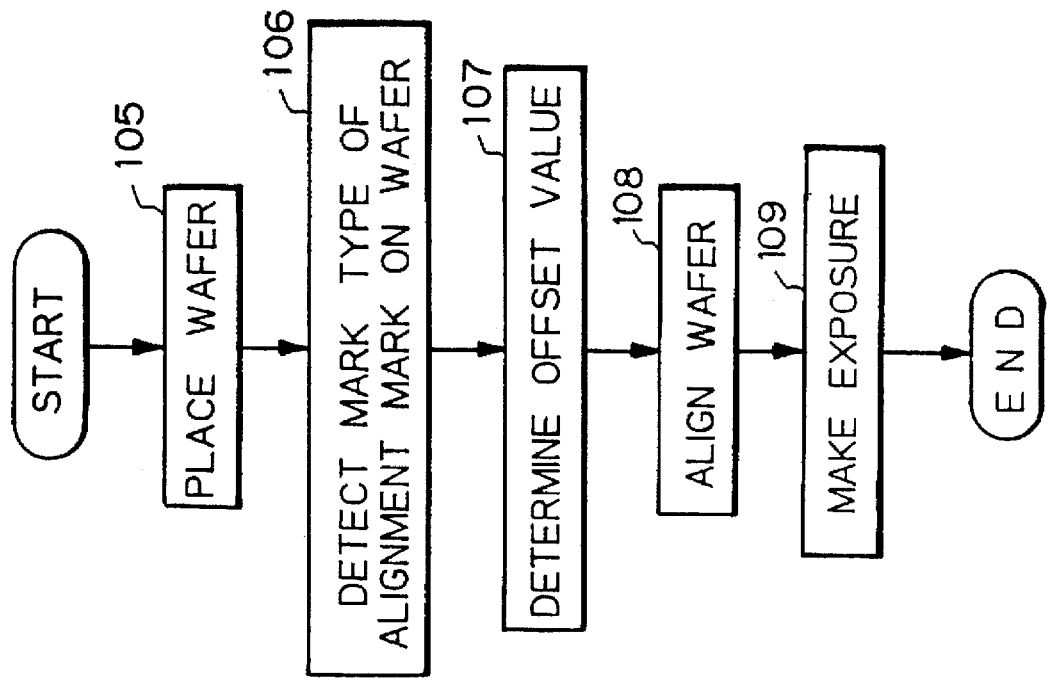
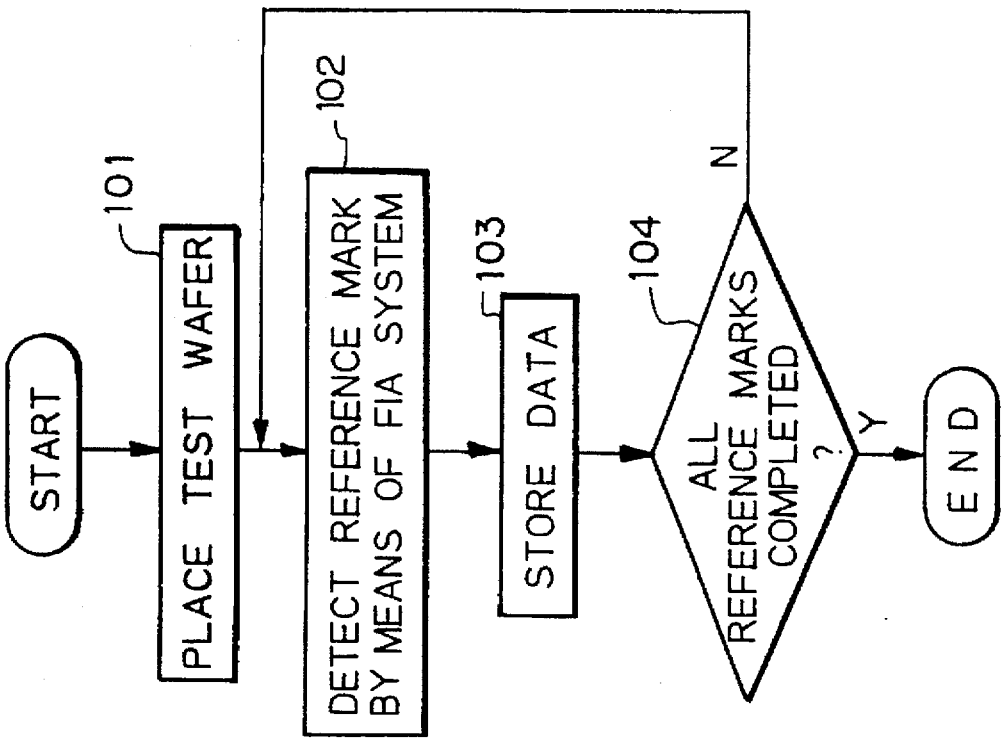

Fig. 7(a)
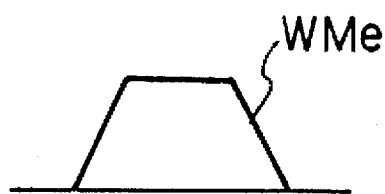
Fig. 7(b)
Fig. 7(c)
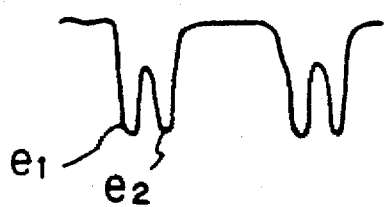
$e_1$  $e_2$
Fig. 7(d)
Fig. 7(e)
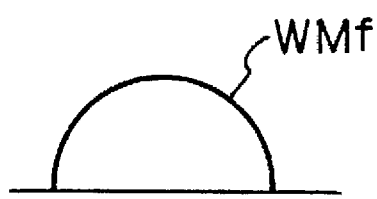
Fig. 7(f)
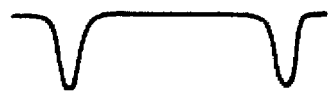
Fig. 7(g)
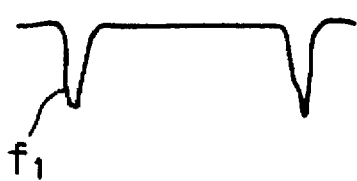
$f_1$
Fig. 7(h)
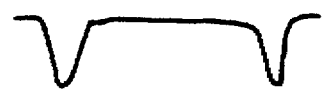

METHOD OF ALIGNING A SUBSTRATE

BACKGROUND OF THE INVENTION

1. Field of the Invention

The present invention relates to a method of aligning a substrate movable in a predetermined plane relative to a predetermined reference position in the plane, and particularly, to a method of aligning a photosensitive substrate relative to a mask having a pattern formed thereon, in order to transfer patterns of the mask onto the photosensitive substrate during a projection exposure process.

2. Description of the Related Art

Various projection exposure apparatuses are widely used to produce products such as semiconductor devices and liquid crystal display devices. In a projection exposure apparatus, generally, a mask or reticle is used which has a circuit pattern formed thereon, and an image of the circuit pattern is projected through a projection lens system onto a photosensitive substrate (or wafer). In a typical production process of semiconductor devices, for example, several to ten-and-several circuit patterns must be registered one after another with precision. For this purpose, it is required to register the circuit pattern(s) previously formed on a wafer and the next circuit pattern to be exposed on the previous circuit pattern(s) with each other. Therefore, many projection exposure apparatuses are provided with an alignment system for optically detecting an alignment mark formed on a wafer. The alignment system detects the position of the alignment mark in a fixed coordinate system (XY-coordinate system), which coordinate system can describe the position into which the wafer is to be moved for the alignment purpose. Then, the alignment system forces a storage unit to output the relative positional relationship between the alignment mark and a shot area to be exposed. The storage unit contains data representing the relative positional relationships between the alignment mark and respective shot areas. The storage unit also contains the data representing the distance between the detection center of the alignment system and the position at which the center of the reticle is projected through the projection lens system. This distance is the "an amount of a baseline", and the alignment system forces the storage unit to output the amount of the baseline as well. Then, the alignment system moves the wafer to the desired position for exposure in accordance with the detected position of the alignment mark, the outputted relative positional relationship and the amount of the baseline, to complete the alignment operation.

There are two sorts of major approaches to the detection of the position of an alignment mark formed on a wafer: (1) focusing a light beam (for example, a laser beam) to a spot on the wafer, causing relative movement between the alignment mark and the spot so as to perform scanning of the alignment mark by the spot, and detecting photoelectrically any scattered light or diffracted light coming from the alignment mark by means of, for example, a photomultiplier or a photodiode (this is referred to as the "light beam scanning method" hereinafter); and (2) illuminating the area of the alignment mark on the wafer, picking up the image of the alignment mark by means of a television camera (for example, a vidicon or a CCD) to generate a video signal, and processing the video signal to detect the position of the alignment mark (this is referred to as the "imaging method" hereinafter).

An alignment system using the light beam scanning method is disclosed in U.S. Pat. No. 4,655,598. The alignment system includes a light source which is a laser source generating a single wavelength laser beam, in order that the chromatic aberration of the projection lens system should not affect the laser beam. Unfortunately, since a wafer ready for exposure generally has a photoresist layer of about 0.5 to 2 μm thick coated on its surface, a single wavelength laser beam impinged on the wafer will produce significant interference fringes due to the presence of the photoresist film, which tends to result in a false detection of the position of the alignment mark.

In an attempt to reduce the interference effect caused by the photoresist film, it has been proposed to use either a multiwavelength light beam or a wideband light beam to illuminate the alignment mark. This is just the imaging method (i.e., method (2) above). An example of this method is disclosed in Japanese Published Patent Application No. Sho-62-171125 (No. 171,125/1987). The alignment mark is illuminated with an illumination beam having a wavelength bandwidth of about 300 nm (which is selected to avoid the sensitive wavelength region of the photoresist). Then, the image of the alignment mark is picked up by means of a television camera for detection. The alignment mark can be detected with high sharpness because such illumination beam will not produce any significant interference when reflected by the wafer surface coated with the photoresist film. This type of alignment system is often called "off-axis alignment system" as it has its optical axis spaced from the optical axis of the projection lens system by a predetermined distance. Since the illumination light beam has a broad wavelength bandwidth, the image forming lens system used in the alignment system is designed to compensate for the chromatic aberration relative to the illumination beam.

In a conventional projection exposure apparatus, there have been a problem relating to its alignment system. For example, we consider the off-axis type of alignment system. As described, such alignment system has its image forming lens system so designed and adjusted as to eliminate any chromatic aberration; however, there still remain some kinds of aberrations other than chromatic aberration (for example, those called coma and astigmatism). Any tendency of the optical system in the alignment system to produce aberrations would result in detection offsets upon detecting the position of the alignment mark. Further, there arises an additional problem that different types of alignment marks (which differ, for example, in shape, in the thickness of the film forming the pattern of the alignment mark, in the reflectance of the film, in the pitch of the parallel strips if the alignment mark has a pattern composed of such strips, etc.) produce detection offsets of different values. For example, consider two alignment marks which are different in the thickness of the film forming their patterns. Light beams reflected by the top surfaces of the patterns of these alignment marks have different phase conditions. These different phase conditions in the reflected light beams produce detection offsets of different values even though the position of the television camera (which is used for detection of the alignment mark) relative to the alignment mark is the same.

As previously described, in a typical production process of products such as semiconductor devices, several to ten-and-several circuit patterns have to be registered one after another with precision. In such fabrication process, several different types of alignment marks are often used, and in general, different types of alignment marks have different values of detection offsets associated with them.

The above problems occur not only in the off-axis type of alignment system but also in the light beam scanning type of alignment system (i.e., one which uses method (1) above). In general, any of the alignment systems which detect a first dimension diffracted light and multi-dimension diffracted light such as second dimension diffracted light, have a tendency to produce detection offset values as well.

Nevertheless, in the past, products have been produced using alignment methods which ignore the fact that different types of alignment marks have different values of detection offsets associated with them. As the result, when several to ten-and-several circuit patterns have been registered one after another, the last one may be significantly out of alignment relative to the first one, and products having circuit patterns in such an out-of alignment are actually found.

The inventor of the present invention has made an exhaustive study of this problem to achieve the present invention in which (1) a detection offset value associated with each of a plurality of different marks is measured before actual alignment operations, and the detected measurements are stored in a memory, (2) a sort (or a mark type) of an alignment mark is determined upon detection of the position of the alignment mark, and the detection offset value of one alignment mark in said plurality of different alignment marks is outputted from the memory, which one marks is of the same type as the mark actually determined, (3) a correction or compensation is made to either the detection results of the position of the alignment mark or the distance by which the wafer is to be moved for alignment, taking into account the outputted detection offset value; and (4) the wafer is moved to the desired position for exposure in accordance with the detection results or the distance thus compensated, to complete the alignment operation.

SUMMARY OF THE INVENTION

Accordingly, it is an object of the present invention to provide a method of aligning a substrate, wherein the position to which the substrate is to be moved is controlled in accordance with (i) the relative positional relationship between a predetermined reference position and an alignment mark formed on the substrate and (ii) the sort (or the mark type) of the alignment mark. This enables precision alignment of the substrate irrespective of the sort (or the mark type) of the alignment mark on the substrate.

It is another object of the present invention to provide a method of aligning a substrate, wherein the mark type of the alignment mark is determined by detecting the above mentioned relative positional relationship in correlation with the positions of the alignment mark in the height direction. This enables precision alignment of the substrate for any of a plurality of different sorts (or types) of alignment marks.

In order to achieve the above and other objects, there is provided according to the present invention a method of aligning a substrate (W) movable in a predetermined plane relative to a predetermined reference position in the plane, comprising the steps of: obtaining a relative positional relationship between the reference position and an alignment mark (WMx, WMy) formed on the substrate (W); and controlling the position in the plane to which the substrate (W) is to be moved, based on the relative positional relationship and a sort (or mark type) of the alignment mark (WMx, WMy).

Specifically, according to the present invention, the relative positional relationship between the reference position and the alignment mark on the substrate is obtained. The relative positional relationship thus obtained contains an offset which depends on the mark type of the alignment mark on the substrate (different types of alignment marks, for example, have different cross-sectional shapes or different thicknesses). Therefore, in order to compensate for the offset which depends on the mark type of the alignment mark, the position to which the substrate is to be moved is controlled based on the obtained relative positional relationship and the mark type of the alignment mark on the substrate, so as to align the substrate with the reference position. This enables more accurate alignment of the substrate with the reference position irrespective of the mark type of the alignment mark formed on the substrate. Also, this eliminates the necessity to use, for the optical system of the alignment system for detecting the alignment mark on the substrate, an expensive optical system which aberration is compensated or corrected, so that the cost for the alignment system can be reduced.

Moreover, a method according to the present invention may further comprise the step of moving the substrate in a height direction which is substantially perpendicular to the predetermined plane while detecting the relative positional relationship in the predetermined plane in correlation with the positions of the alignment mark in the height direction, thereby determining the mark type of the alignment mark. This enables precision alignment of the substrate according to any one mark type in a plurality of different types of alignment marks.

BRIEF DESCRIPTION OF THE DRAWINGS

The above and other objects, features, and advantages, of the present invention will be appreciated as the same becomes better understood by reference to the following detailed description when considered in connection with the accompanying drawings in which:

FIG. 2 shows the relationship between one of shot areas on a wafer and the associated alignment marks;

FIGS. 4(a) and 4(b) are flow diagrams showing an example of detection process of reference marks on a test wafer and an example of detection process of alignment marks on an actual wafer, respectively;

FIG. 7 illustrates the difference in detection signals obtained by means of the FIA (Field Image Alignment) system for two different types of alignment marks.

PREFERRED EMBODIMENTS OF THE INVENTION

Figure 1:
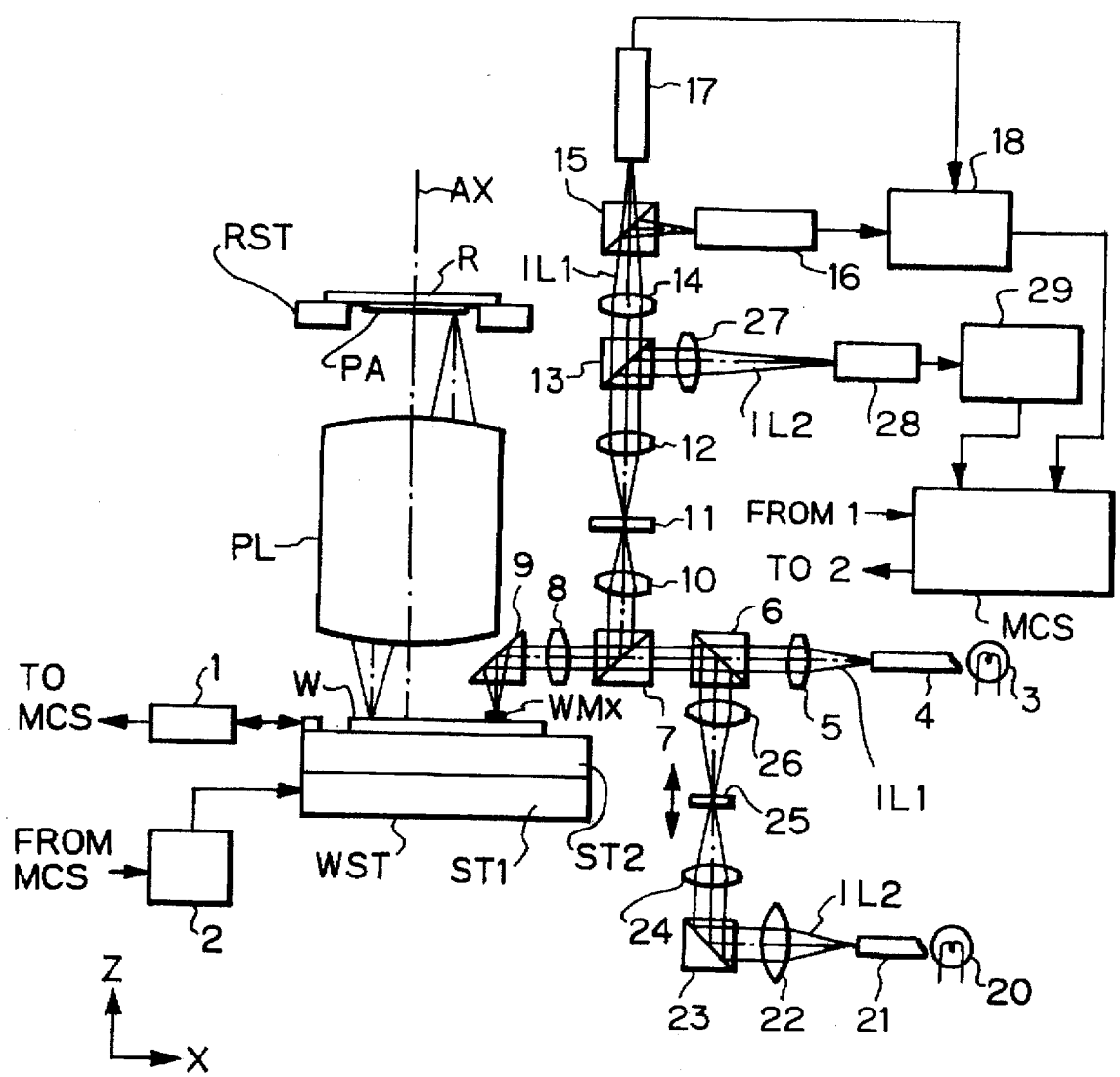
FIG. 1 is a schematic of a projection exposure apparatus in which a method according to an embodiment of the present invention may be carried out.

FIG. 1 is a schematic of a projection exposure apparatus in which a method according to an embodiment of the present invention may be carried out.

As shown in FIG. 1, a reticle R is placed on a reticle stage RST. The reticle R has a circuit pattern formed thereon which is confined within a pattern area PA defined on the reticle R. The pattern area PA may be uniformly illuminated with an illumination light beam from an illumination system (not shown). An image of the circuit pattern formed within the pattern area PA is projected through a projection lens system PL onto a wafer W with demagnification of the image. Here, we refer to the direction of the optical axis AX of the projection lens system PL as a Z-direction, and a plane perpendicular to the optical axis AX as an XY-plane. The X- and Y-directions are perpendicular to each other. The wafer W is placed on a wafer stage WST which is movable both in the X- and Y-directions by means of a drive unit 2. The wafer stage WST comprises an XY-stage member ST1 movable both in the X- and Y-directions and a Z-stage member ST2 placed on the XY-stage ST1 and movable in the Z-direction. The drive unit 2 is also used to move the Z-stage ST2 in the Z-direction. The position of the wafer stage WST in the XY-coordinate system (we call this simply as the "coordinate position" hereinafter) is continuously detected by a laser interferometer 1 and the detected coordinate position is outputted to a main control system MCS.

The projection exposure apparatus includes an alignment system for detecting the coordinate positions of alignment marks. This alignment system is of the off-axis type, i.e., it is a so-called field image alignment system ("FIA system" hereinafter). The FIA system will be described in detail in the following.

An illumination light beam IL1 irradiated from a light source 3 is guided through a bundle of optical fibers 4 and emitted from the emission end of the optical fiber bundle 4. The light source 3 comprises a white light source such as a halogen lamp, or a high-intensity multi-color LED (light emitting diode). The light beam IL1 emitted from the optical fiber bundle 4 passes through a condenser lens 5, a beam splitter 6 and a half mirror 7 into an objective lens 8. The light beam IL1, having passed through the objective lens 8, is reflected by a prism 9 (or alternatively, a mirror) to be bent substantially at a right angle and illuminates the surface of the wafer W. The prism 9 is fixedly mounted at a position adjacent a lower end of a barrel of the projection lens system PL where the prism 9 will not hinder any portion of the projection field of the projection lens system PL. Though not shown, there is disposed an illumination field stop on an imaginary plane which cuts the optical path of the illumination light beam IL1 between the emission end of the optical fiber bundle 4 and the objective lens 8 and which is optically conjugate to the surface of the wafer W. The field stop delimits the illumination field for illuminating the areas of alignment marks WMx and WMy (see FIG. 2; only one alignment mark WMx is shown in FIG. 1) with the illumination light beam IL1 from the light source 3. The optical axis of the objective lens 8 is bent by the prism so as to be normal to the surface of the wafer W.

The illumination light beam IL1 impinged to the surface of the wafer W is reflected back by the surface into prism 9, and then, passes through the objective lens 8, is reflected by the half mirror 7 and converged by a lens 10 onto an index plate 11. The index plate 11 is disposed on an imaginary plane which is optically conjugate to the surface of the wafer W with respect to the objective lens 8 and the lens 10, so that an image of the alignment mark WMx on the wafer W is formed on the index plate 11. The index plate 11 has a pair of elongate index marks (picked up in an imaging plane IP of a CCD 16 as images 11a and 11b in FIG. 3) extending in the Y-direction and another pair of elongate index marks (picked up in said plane IP as images 11c and 11d in FIG. 3) extending in the X-direction, each index mark comprising three fine bars. The light beam IL1, having passed through the index plate 11, further passes through a relay lens 12, a beam splitter 13 and a relay lens 14 into a beam splitter 15. A portion of the light beam is reflected by the beam splitter 15 and received by a charge coupled imaging device (CCD) 16, so that an image of the alignment mark WMx and images of the index marks are formed on the imaging plane of the CCD 16. The remaining portion of the light beam is transmitted through the beam splitter 15 and received by another CCD 17.

FIG. 2 shows the relationship between one (Sn) of a plurality of shot areas defined on the wafer W and the associated alignment marks WMx and WMy formed on the wafer W. The alignment marks WMx and WMy are formed on and within the scribe-lines SCL surrounding that one shot area Sn. One alignment mark WMx has its center positioned on that line which passes through the center SC of the shot area Sn and extends in the Y-direction, while the other alignment mark WMy has its center positioned on that line which passes through the center SC of the shot area Sn and extends in the X-direction. The alignment mark WMx is formed so as to be a grating pattern composed of five parallel bars (more exactly, elongate rectangles) each extending in the Y-direction and disposed side-by-side with uniform intervals in the X-direction. Similarly, the other alignment mark WMy is formed so as to be a grating pattern composed of five parallel bars (more exactly, elongate rectangles) each extending in the X-direction and disposed side-by-side with uniform intervals in the Y-direction.

Figure 3A:
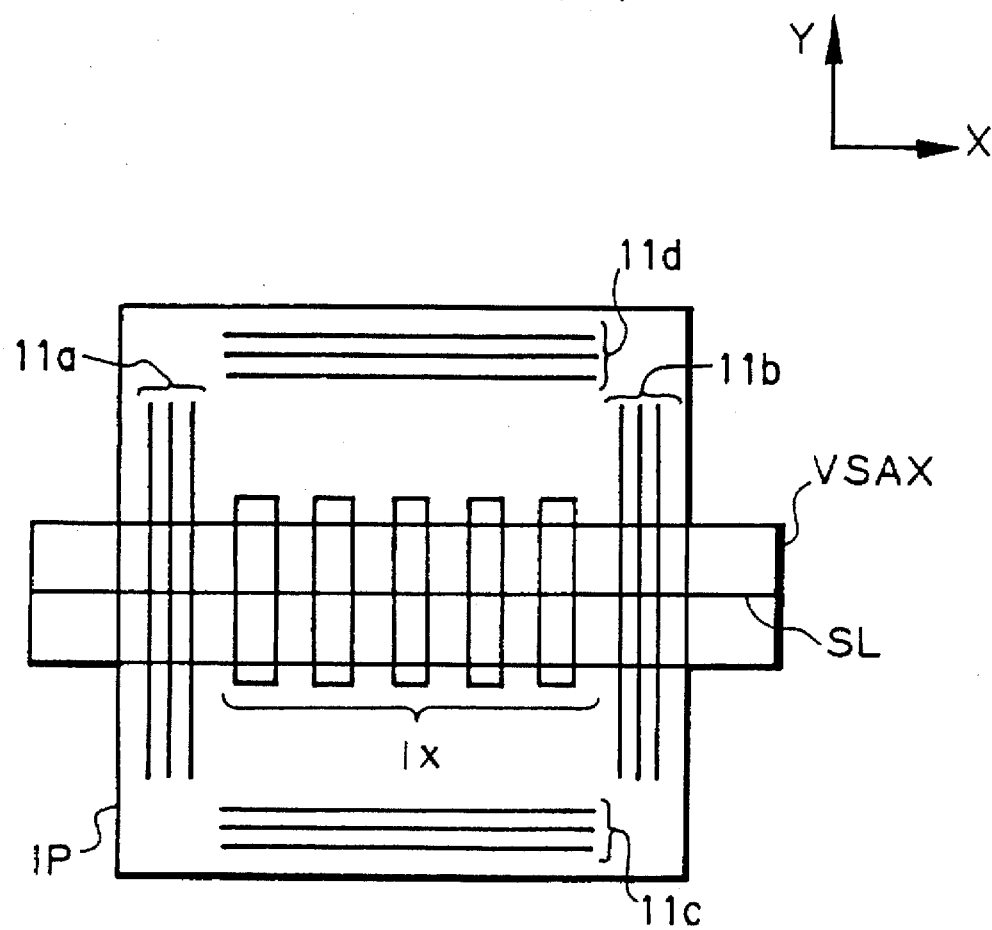
FIG. 3(a) shows images formed on an imaging plane of an image pick-up device when the alignment mark WMx in FIG. 2 is detected by an FIA system.
Figure 3B:
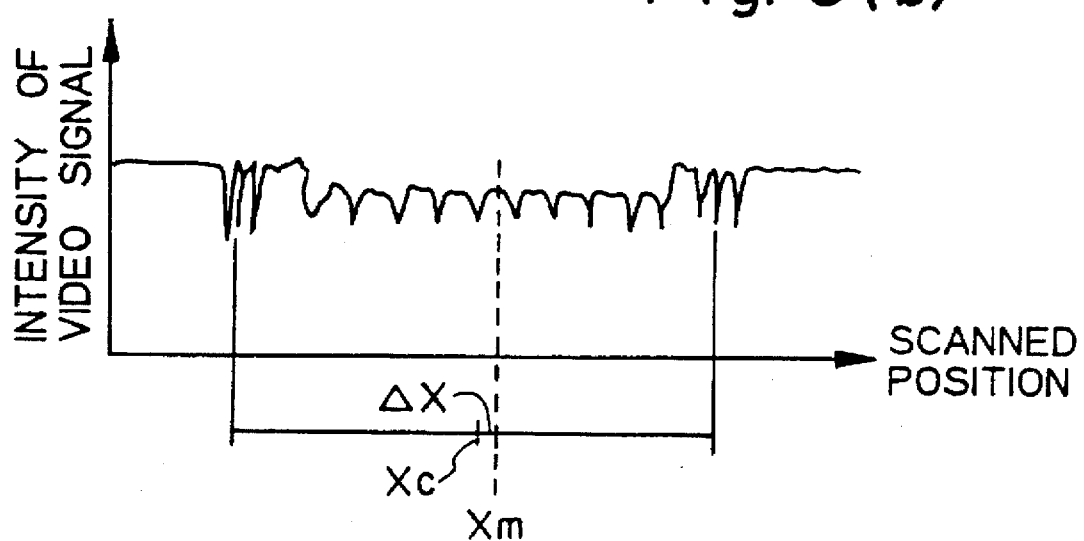
FIG. 3(b) shows the relationship between the scanned position and the intensity of the video signal from the image pick-up device.
Figure 5A:
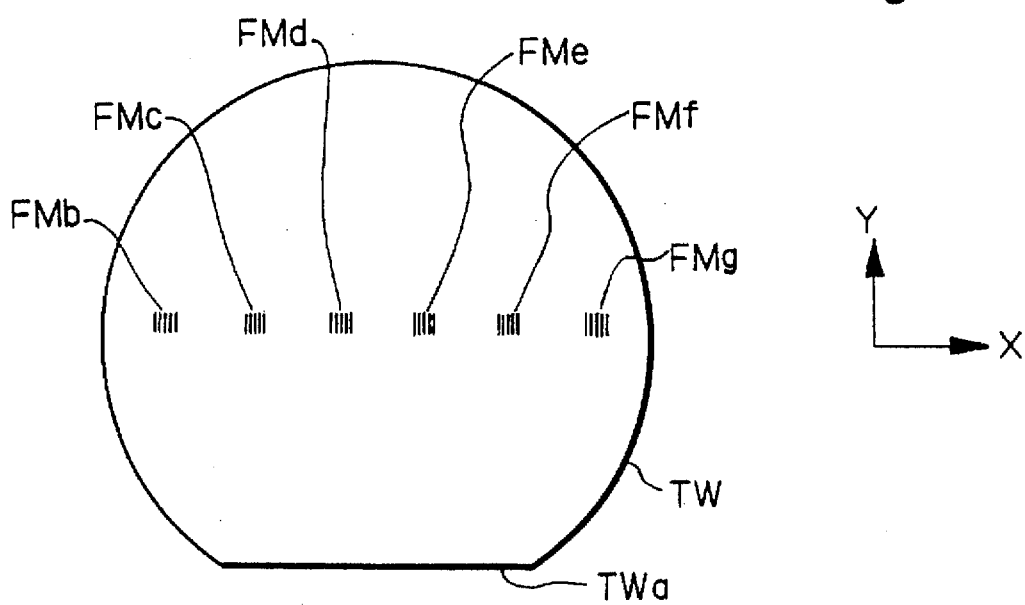
FIG. 5(a) shows a test wafer which may be used for the method of the present invention.
Figure 5B:
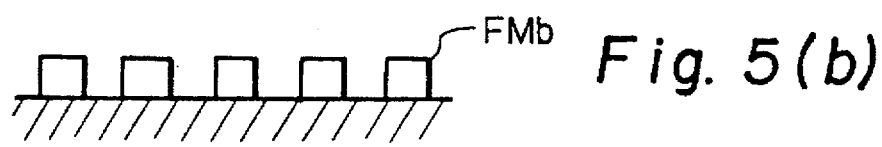
FIGS. 5(b) to 5(g) show cross-sectional shapes of various reference marks formed on the test wafer.
Figure 5C:
Figure 5D:
Figure 5E:
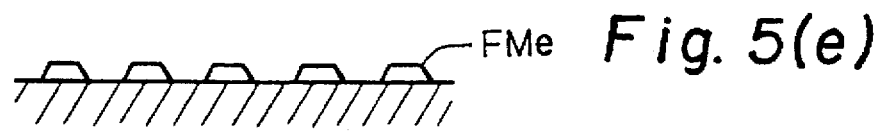
Figure 5F:
Figure 5G:

FIG. 3(a) shows images formed on an imaging plane IP of the CCD 16 of the FIA system. There are formed on the imaging plane IP images 11c, 11d of the pair of index marks extending in the X-direction and images 11a, 11b of the pair of index marks extending in the Y-direction. Also, there is formed on the imaging plane IP an image Ix of the alignment mark WMx between the images 11a, 11b of the last mentioned pair of index, marks. The CCD 16 electronically scans these three images along a scanning line SL within the video sampling area VSAx. The resulting video signal has a waveform such as shown in FIG. 3(b), where the vertical axis represents the intensity of the video signal and the horizontal axis the scanned position along the scanning line SL. As seen from FIG. 3(b), the three bars of each set of the index marks extending in the Y-direction are picked up by the CCD 16 to be three black lines, so that the intensity of the video signal has six minima at the positions corresponding to the six bars of these two index marks. On the other hand, since the alignment mark WMx is composed of five elongate rectangles as described, the total of ten longer edges of the rectangles are picked up by the CCD 16 to be ten black lines, so that the video signal has additional ten minima at the positions corresponding to the longer edges. The alignment system includes a signal processing unit 18 which performs calculations based on the video signal outputted from the CCD 16 so as to obtain the position Xc of the midpoint between the images 11a and 11b of the index marks (which is the center of the index plate 11), the position Xm of the center of the image Ix of the alignment mark WMx, and the difference $\Delta X$ between the positions Xc and Xm ($\Delta X = Xm - Xc$). The value of $\Delta X$ is positive when the position Xm of the center of the alignment mark WMx is on the +X side relative to the position Xc of the center of the index plate 11, while it is negative when the position Xm is on the −X side relative to the position Xc. At this stage, the main control system MCS reads the signal outputted from the laser interferometer 1 representing the position of the wafer stage WST and the value of the difference $\Delta X$ outputted from the signal processing unit 18, and stores them in the main control system MCS itself.

The other alignment mark WMy on the wafer W is treated in the same manner so that the corresponding difference ΔY is obtained by means of the CCD 17 and the signal processing unit 18.

In general, the height (i.e., the position in the Z-direction) of the surface of the wafer W is so controlled by the main control system MCS as to provide the best quality for the image picked up by the CCD during the detection of the alignment mark on the wafer W by the FIA system described above. This means that the wafer W is to be positioned at such height that the surface of the wafer W may be aligned on an imaginary horizontal plane which is optically conjugate to the imaging plane of the CCD in the FIA system. The height of this horizontal plane is referred to as the "focal position in the FIA system" hereinafter.

The projection exposure apparatus, as described in more detail below, includes a detection system for detecting the height (i.e., the position in the Z-direction) of the surface of the wafer W (this detection system is referred to as the "automatic focusing system" hereinafter). The automatic focusing system has its light path, a part of which is, however, common to a part of a light path of the FIA system described above. The automatic focusing system will be now described with reference to FIG. 1.

As shown in FIG. 1, an illumination light beam IL2 irradiated by a light source 20 is guided through a bundle of optical fibers 21 and emitted from an emitting end of the optical fiber bundle 21. The light beam IL2 generated by the light source 20 has a longer wavelength than the light beam IL1 utilized by the FIA system. Having exited the optical fiber bundle 21, the light beam IL2 passes through a lens 22, a mirror 23 and a lens 24 to impinge on a slit plate 25 having a slit-like aperture. A portion of the light beam IL2 passes through the aperture of the slit plate 25, then passes through a lens 26 and is reflected by the beam splitter 6 so as to be combined with the light beam IL1 from the light source 3. The combined light beam passes through the half mirror 7 and the lens 8, and is reflected by the prism 9 onto the wafer W. Thereby an image of the slit (i.e., an image of the slit-like aperture) is projected on the surface of the wafer W. The light beam IL2 forming the image of the slit is reflected by the surface of the wafer W to pass through the lens 10, the index plate 11 and the lens 12, and reflected by the beam splitter 13. The beam splitter 13 comprises a color filter designed to transmit the light beam IL1 for the FIA system but to reflect the light beam IL2 for the automatic focusing system. The light beam IL2 reflected by the beam splitter 13 is converged by a lens 27 and received by a detector 28 which photoelectrically detects the light beam IL2. The detector 28 is provided with a second slit plate (not shown) adjacent its light-receiving surface, which has a slit-like aperture like the slit plate 25, and a portion of the light beam IL2 passes through the aperture of the second slit plate to reach a light-receiving surface of the detector 28. The detector 28 outputs a detection signal to a signal processing unit 29, which signal represents the intensity of the received light beam.

In operation, in order to detect the height of the surface of the wafer W, the main control system MCS energizes the light source 20 to irradiate the light beam IL2, while causes the slit plate 25 to vibrate with a predetermined amplitude, the direction of the vibration being parallel to the optical axis of the automatic focusing system as shown in FIG. 1. The center of the amplitude of the vibrating slit plate 25 is selected to be on an imaginary plane which is optically conjugate to the light-receiving surface of the detector 28. The signal processing unit 29 detects the signal from the detector 28 using synchronous detection method, and outputs a detection signal which represents the displacement ΔZ in the Z-direction of the surface of the wafer W from a predetermined height (i.e., a predetermined position in Z-coordinate) that is selected by the automatic focusing system. This predetermined height as defined by the automatic focusing system is preselected to coincide with the focal position of the FIA system which, in turn, is preselected to coincide with the image forming position (plane) of the projection lens system PL.

The operation of the projection exposure apparatus according to the present invention will now be described with reference to the flow diagrams of FIGS. 4(a) and 4(b).

In FIG. 4(a), starting with step 101, the main control system MCS places on the wafer stage WST a special wafer that has a plurality of different types of reference marks formed thereon (this wafer is referred to as the "test wafer TW" hereinafter). The test wafer TW is made of the same material as wafers actually processed in the apparatus, and has six reference marks FMb, FMc, FMd, FMe, FMf and FMg formed at predetermined positions on the wafer by using, for example, etching. The reference marks are disposed on a predetermined line which is parallel to the straight edge of a cut-out portion (i.e., orientation flat) TWa formed in a portion of the periphery of the test wafer TW, and spaced from the orientation flat TWa by a predetermined distance. Each of the six reference marks is formed to have a grating pattern composed of five parallel bars (more exactly, elongate rectangles) each extending in the direction perpendicular to the orientation flat TWa and disposed side-by-side with uniform intervals in the direction parallel to the orientation flat TWa, like the alignment mark WMx (see FIG. 2). The test wafer TW will be placed on the wafer stage WST with its orientation flat TWa extending in the X-direction, when the five parallel bars (more exactly, elongate rectangles) of each of the six reference marks will extend in the Y-direction.

FIGS. 5(b) to 5(g) show the cross-sectional shape of the reference marks FMb through FMg, respectively. In the present example, the reference marks FMb through FMg have cross-sectional shapes (i.e., the shape of the bars of the marks sectioned by a plane which is perpendicular to the longitudinal direction of the bars) different from one another. As shown in FIGS. 5(b) to 5(g), four of the reference marks (FMb, FMc, FMd and FMg) have bars with rectangular cross-sectional shapes, the heights of which are, however, different from one another; the reference mark FMb has the highest bars, while the reference marks FMc, FMd and FMg have lower and lower bars in this order. The reference mark FMe has bars with a trapezoidal cross-sectional shape. The reference mark FMf has bars with a semicircular cross-sectional shape. The reference mark FMg has bars whose top surfaces have a higher reflectivity than those of the other five reference marks.

Figure 6:
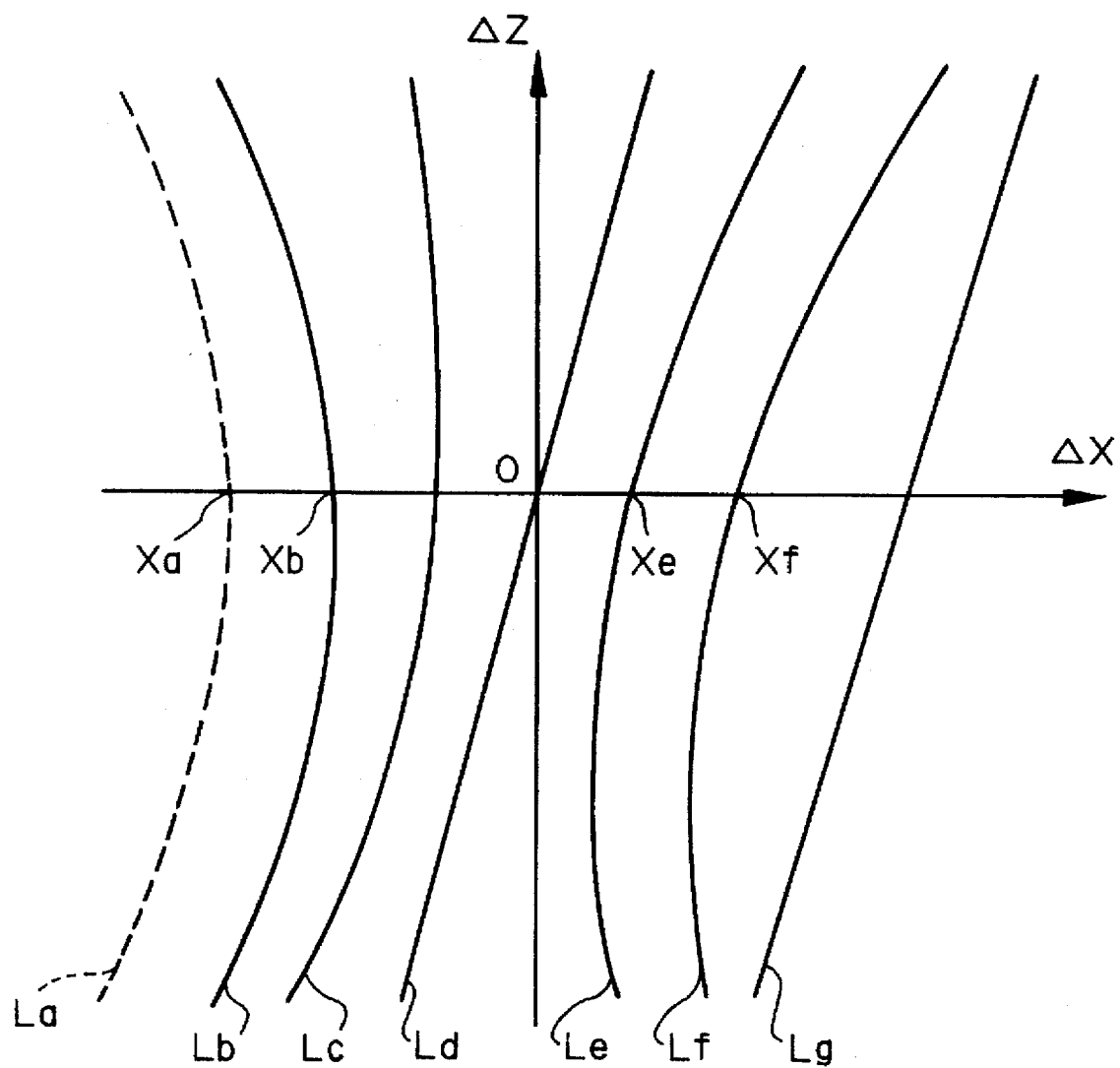
FIG. 6 is a graph showing the detection offset informations of the reference marks in FIGS. 5(b) to 5(g) and the results of the detection of alignment mark in FIG. 2.

The process proceeds to step 102, where the main control system MCS positions the reference mark FMb at the detection center of the FIA system. The position of each reference mark on the test wafer TW is prestored in the main control system MCS, and the test wafer TW has been placed exactly at the predetermined position on the wafer stage WST. Therefore, the main control system MCS can accurately position the reference mark FMb at the detection center of the FIA system by controlling the position of the wafer stage WST based on the values of X- and Y-coordinates supplied from the laser interferometer 1. Then, the main control system MCS detects the position of the reference mark MFb by means of the FIA system described above. At this stage, the main control system MCS controls the drive unit 2 so as to gradually change the height (i.e., the position in Z-direction) of the surface of the test wafer TW within a predetermined range, a center of which is the focal position of the FIA system. During this operation, the main control system MCS reads the detection signals outputted from the signal processing units 18 and 29, and, based on these detection signals, stores i) displacements $\Delta Z$ in the Z-direction of the surface of the test wafer TW from the focal position of the FIA system and ii) offsets $\Delta X$ in the X-direction of the detected center of the reference mark FMb from the detection center (Xc in FIG. 3(b)) of the FIA system (the offset $\Delta X$ is the same as the distance $\Delta X$ of FIG. 3(b)). Further, each displacement $\Delta Z$ and the corresponding offset $\Delta X$ are stored in correlation with each other (for example, the correspondence correlation with their correspondence information). These data may be sampled and stored every time the test wafer TW moves in the Z-direction by a predetermined interval. The informations stored in the main control system MCS at this stage (i.e., the informations relating to the detection offsets of the FIA system) are shown in FIG. 6. In the graph of FIG. 6, the vertical axis represents the displacement $\Delta Z$ of the surface of the test wafer TW (or the reference marks) from the focal position of the FIA system, and the horizontal axis represents the offset $\Delta X$ of the detected center of the reference mark from the detection center of the FIA system. The crossing point of these axes represents the point where $\Delta Z=0$ and $\Delta X=0$. The main control system MCS analogizes the sampled data with a curve, such as a curve Lb for the reference mark FMb, and stores this data as the detection offset information for the reference mark FMb (step 103).

The reference mark FMb is, in fact, positioned exactly at the detection center of the FIA system when the position of the reference mark FMb is detected at step 102 above. Therefore, the offset $\Delta X$ should remain to be zero while the displacement $\Delta Z$ of the surface of the test wafer TW from the focal position of the FIA system changes. Actually, however, as shown in FIG. 6, non-zero offset (Xb) will occur even when the reference mark FMb is detected at the focal position of the FIA system, due to unexpected conditions such as various aberrations induced by the FIA system and an inevitable minute inclination of the optical axis of the FIA system relative to the optical axis AX of the projection lens system PL (i.e., a telecentric inclination).

The process proceeds to step 104, where a determination is made as to whether or not the detection offset informations for all the reference marks FMb through FMg have been obtained and stored. If not, the process repeats steps 102 and 103 for the next reference mark. In this manner, the reference marks are successively positioned at the detection center of the FIA system and the detection offset informations of the reference marks are stored. Finally, the required data for all the six reference marks are stored (the data are represented by respective curves Lb through Lg in the graph of FIG. 6). Specifically, the curve Lc in FIG. 6 represents the detection offset information of the reference mark FMc shown in FIG. 5(c), further, the curve Ld represents the detection offset information of the reference mark FMd, the curve Le represents the detection offset information of the reference mark FMe, the curve Lf represents the detection offset information of the reference mark FMf and the curve Lg represents the detection offset information of the reference mark FMg. AS seen from FIG. 6, the curves in the graph showing the detection offset informations have different curvatures and/or inclinations corresponding to the mark types of the reference marks with which detections have been made.

Described above is the process of acquiring and storing the detection offset informations of a plurality of different types of reference marks FMb through FMg formed on the test wafer TW (steps 101–104). This process need not be repetitively performed; in general, it is required to perform this process only once, for example, after the optical system of the FIA system has been adjusted at the assembling of the projection exposure apparatus.

FIG. 4(b) shows a flow diagram representing a normal exposure operation, which will now be described in detail. The normal exposure operation starts with step 105, where the main control system MCS places a wafer W onto which the pattern on the reticle R is to be transferred by exposure. Assume that the wafer W has already a plurality of shot area formed thereon. Then, at step 106, the main control system MCS carries out the detection of the alignment mark WMx (or the alignment mark WMy) on the wafer W shown in FIG. 2 by means of the FIA system. At the same time, the main control system MCS controls the drive unit 2 in a similar manner as it does at step 102 described above, i.e., whereby the height (i.e., the position in the Z-direction) of the wafer stage WST is changed within a predetermined range that is centered by the focal position of the FIA system. During that period, the main control system MCS obtains the relationship between the displacements $\Delta Z$ in the Z-direction of the alignment mark from the focal position of the FIA system and the offsets $\Delta X$ in the X-direction of the detected center of the alignment mark from the detection center of the FIA system. The results of the detection thus obtained with respect to the alignment mark WMx is shown by the curve La in FIG. 6 (represented by a broken line).

The process proceeds to step 107, where the main control system MCS obtains an alignment offset value for the detected alignment mark on the wafer W. The plurality of curves shown in FIG. 6 differ from one another in an inclination and/or curvature thereof for different mark types (i.e., for different cross-sectional shapes of the marks). The main control system MCS compares the results of the detection of the alignment mark (represented by the curve La in FIG. 6) with each of the detection offset informations of the reference marks (Lb through Lg) previously stored in the main control system MCS, and selects, among these detection offset informations (Lb through Lg), one which is most close to the curve La in shape and curvature. More particularly, the selection may be, for example, carried out as follows. The values in the $\Delta X$-coordinate of the prestored detection offset information curve Lb for the reference mark FMb are substrated from those of the curve La for the alignment mark WMx, and a deviation of the subtracted values in the $\Delta X$-coordinate along the $\Delta Z$-coordinate is obtained. Next, in a similar manner, the values in the $\Delta X$-coordinate of each of other curves Lc through Lg for the reference marks FMc through FMg are subtracted from those of the curve La, and other deviations of the subtracted values in the $\Delta X$-coordinate along the $\Delta Z$-coordinate are obtained in order. Finally, one of the curves Lb through Lg, which has the smallest deviation relative to the curve La is selected. If the results of the curve La comes to be the same as one of the prestored detection offset informations Lb through Lg in curvature and inclination, then the deviation derived from said one detection offset information curve comes to be zero. Therefore, in the case of the example shown in FIG. 6, the main control system MCS selects said one detection offset information which is represented by the curve Lb, which is the most analogous to the curve La for the alignment mark WMx. Then, the main control system MCS derives the value Xb of the detection offset $\Delta X$ at ΔZ=0, as the alignment offset value for the alignment mark WMx this example, this alignment offset value Xb is negative.

The detected offset value Xa for the alignment mark WMx, which is detected at the focal position of the FIA system, contains the above alignment offset value Xb. Thus, the main control system MCS uses this alignment offset value Xb so as to correct the detected offset value Xa at ΔZ=0, i.e., to obtain the corrected value of (Xa–Xb). Then, at step 108, the main control system MCS forces the wafer stage WST to move based on the corrected value of (Xa–Xb). Specifically, in the present embodiment, the main control system MCS has prestored data representing the distance between the detection center of the FIA system and the position on the wafer at which the center of the reticle R is projected through the projection lens system PL, the distance being referred to as an amount of a baseline BL. The main control system MCS uses the amount of the baseline BL to move the wafer stage WST in the X-direction by the distance equal to BL+(Xa–Xb). Similar operations are performed in connection with the other alignment mark WMy and the Y-direction, so that the shot area Sn can be accurately registered with the image of the pattern of the reticle R which will be subsequently projected onto the wafer W. Thereafter, at step 109, the pattern of the reticle R is projected onto the wafer W for exposure.

According to the above described method, the position of the alignment mark on the wafer can be detected with precision even if there remain any aberrations in the optical system of the alignment system. Further, in this method, the detection offset values of the alignment system for a plurality of different types of reference marks are prestored, which different types of reference marks correspond to different types of alignment marks possibly formed on the wafer. Therefore, even if the target alignment mark on the wafer that is to be detected at a particular stage in a production process by the alignment system changes from one type of alignment mark to another during the production process, the position of any of the alignment marks on the wafer can be detected with precision, based on i) the information on the mark types of the alignment marks and ii) the prestored, detection offset values for the reference marks. Also, this method eliminates the necessity to use an expensive optical system for correcting any aberrations of the optical system in the alignment system, resulting in a substantial reduction in cost for the alignment system. Further, it is required to determine the mark type of the alignment mark on the wafer only once during the adjustment operation of the optical system of the FIA system, so that no reduction in the throughput occurs by the necessity of such determination.

It is appreciated that various modifications may be made to the method of the present embodiment described above. For example, the method may comprise another sequence in which correction is made not to the detection results obtained by the FIA system but to the distance by which the wafer stage WST is to moved when said stage WST is moved based on the detection results.

Also, at step 108, an enhanced global alignment (EGD) may be performed to obtain the arrangement of the shot areas in a fixed coordinate system. The EGA is disclosed in U.S. Pat. No. 4,780,617 and will not be described here in more detail. When the EGA is performed, the position of the alignment mark on the wafer can be detected with precision by taking into account the obtained alignment offset value Xb, as with the method of the present embodiment described above. Then, having obtained the arrangement of the shot areas on the wafer, the main control system MCS forces the wafer stage to move in a stepping manner based on the coordinates representing the arrangement of the shot areas, so as to accurately register each shot area with the image of the pattern of the reticle R to be projected for exposure.

In the method of the present embodiment described above, a situation may occur that the obtained curve La, representing the results of the detection of the alignment mark on the wafer, happens to be close to two of the curves in FIG. 6, such as curves Le and Lf, to substantially the same extent, so that the main control system MCS can not reasonably determine as to which of the values Xe and Xf is to be used as the alignment offset value for that alignment mark WMx. In such a case, the main control system MCS repeats the operation of step 106 with increased sensitivity of the FIA system for detection of that alignment mark. As shown in FIG. 7, when an alignment mark WMe comprising a trapezoidal cross-sectional shape is detected by the FIA system, the detection signal has two bottom portions e1, e2 for each of the opposite edges of the trapezoidal shape. In contrast, when an alignment mark WMf comprising a semicircular cross-sectional shape is detected, the detection signal has a single bottom portion f1 for each of the opposite edges of the semicircular shape. Additionally, as shown in FIG. 7, during the movement of the wafer stage WST in the Z-direction, the detection signals obtained from these alignment marks WMe and WMf change in different manners. These characteristics of the detection signals may be used to make a correct determination of the mark type (cross-sectional shape) of the alignment mark on the wafer, so that the alignment offset value can be suitably determined.

In the method of the embodiment described above, the six reference marks are differentiated from one another in cross-sectional shape. However, the reference marks may be differentiated in other attributes, such as the width or pitch of the patterns of each reference mark, or the reflectivity of the pattern. The more types of reference marks are used for obtaining the detection offset informations in advance, the more accurately the alignment offset value for a particular alignment mark on the wafer can be determined during the alignment operation. In the method of the embodiment described above, if the mark type of the alignment mark on the wafer is known in advance to be identical to one of the reference marks, step 160 in the process of FIG. 4(b) may be omitted and the desired alignment offset value can be determined using the prestored, detection offset information which corresponds to that identical one of the reference marks.

In the method of the embodiment described above, the six reference marks are formed on a single test wafer TW. However, they may be formed on separate test wafers, or all of them may be formed directly on the wafer stage WST. Further, unlike the method of the embodiment described above, without using no reference mark formed on the test wafer TW, a plurality of different types of detection offset informations may be derived by calculation taking account of the aberrations and/or the telecentric inclination of the optical system of the FIA system, and stored in advance of actual alignment operations.

Moreover, the present invention is applicable not only to the alignment systems of the type as described above, but also to the alignment systems of the light beam scanning type in which the wafer is moved relative to a light beam so as to scan the alignment mark on the wafer by the light beam, and the diffracted light from the alignment mark is detected so as to detect the coordinate position of the alignment mark. According to this laser step alignment system, the same advantages can be derived.

Although a preferred embodiment of the present invention and several modifications thereto have been shown and described in detail, it should be understood that various changes, alterations and further modifications may be made thereto and the present invention may be embodied in various other forms without departing from the spirit and the scope of the present invention.

What is claimed is:

1. A method of aligning a substrate, comprising the steps of:

detecting the position of an alignment mark formed on the substrate in a predetermined plane wherein the substrate moves by means of a predetermined alignment sensor;

determining a type of the alignment mark; and aligning the substrate based on:
   i) detection offset information obtained corresponding to the determined type of the alignment mark; and
   ii) the position of the detected alignment mark.

2. The method according to claim 1, further comprising the step of correcting the position of the detected alignment mark based on the determined type of mark, wherein said aligning step is conducted by aligning the substrate based on the corrected position of the alignment mark.

3. The method according to claim 1, further comprising the step of correcting an amount of movement of the substrate obtained from the detected position of the alignment mark corresponding to the determined type of the alignment mark, wherein said aligning step is conducted by aligning the substrate based on the corrected amount of movement of the substrate.

4. The method of according to claim 1, wherein said step of detecting the position of the alignment mark is conducted by detecting the position of the alignment mark of the substrate by means of the alignment sensor while the substrate moves only in a direction perpendicular to said predetermined plane from a reference position wherein the alignment mark is first detected, and by obtaining a relation between an amount of movement of the substrate from the reference position and an amount of change of the position detected by the alignment sensor, wherein said step of determining a type of the alignment mark is conducted based on said obtained relation.

5. The method according to claim 1, further comprising the steps of:

preparing the detection offset information of the alignment sensor corresponding to each of a plurality of types of the alignment marks;

selecting from among a plurality of items of the prepared detection offset information one item of detection offset information corresponding to the detected type of the alignment mark; and correcting the position of the detected alignment mark based on the selected item of detection offset information.

6. The method according to claim 5, wherein the plurality of types of the alignment marks differ from one another in at least one of a sectional shape of the mark, a height thereof, reflectivity thereof, a width thereof and a pitch between adjacent marks.

7. The method according to claim 1, further comprising the step of projecting a pattern of a mask onto the substrate.

8. A method of aligning a substrate, comprising the steps of:

detecting the position of an alignment mark formed on the substrate by means of a predetermined optical sensor;

preparing a plurality of items of detection offset information of the optical sensor corresponding to each of a plurality of types of the alignment marks, the item of detection offset information being obtained by optical characteristics of the optical sensor;

selecting from among the plurality of items of the prepared detection offset information one item of detection offset information corresponding to the detected type of the alignment mark; and aligning the substrate based on:
   i) the selected item of detection offset information; and
   ii) the position of the detected alignment mark.

9. The method according to claim 8, wherein the items of detection offset information are obtained by at least one of the aberration of an optical system of the optical sensor and the inclination of a telecentric system.

10. The method according to claim 8, wherein the plurality of types of the alignment marks differ from one another in at least one of a sectional shape of the mark, a height thereof, reflectivity-thereof, a width thereof and a pitch between adjacent marks.

11. The method according to claim 8, further comprising the step of projecting a pattern of a mask onto the substrate.

12. A method of aligning a substrate, comprising the steps of:

detecting the position of an alignment mark formed on the substrate by means of a predetermined alignment sensor;

preparing a plurality of items of detection offset information of the alignment sensor corresponding to each of a plurality of types of the alignment marks which differ from one another in sectional shapes thereof;

selecting from among the plurality of items of the prepared detection offset information one item of detection offset information corresponding to a sectional shape of the detected alignment mark; and aligning the substrate based on:
   i) the selected item of detection offset information; and
   ii) the position of the detected alignment mark.

13. The method according to claim 12, further comprising the step of projecting a pattern of a mask onto the substrate.

14. A method of aligning a substrate, comprising the steps of:

detecting the position of an alignment mark formed on the substrate by means of a predetermined alignment sensor;

preparing a plurality of items of detection offset information of the alignment sensor corresponding to each of a plurality of types of the alignment marks which differ from one another in the height thereof;

selecting from among the plurality of the prepared items of detection offset information one item of detection offset information corresponding to the height of the detected alignment mark; and aligning the substrate based on:
   i) the selected item of detection offset information; and
   ii) the position of the detected alignment mark.

15. The method according to claim 14, further comprising the step of projecting a pattern of a mask onto the substrate.

16. A method of aligning a substrate, comprising the steps of:

detecting the position of an alignment mark formed on the substrate by means of a predetermined alignment sensor;

preparing a plurality of items of detection offset information of the alignment sensor corresponding to each of a plurality of types of the alignment marks which differ from one another in the reflectivity thereof;

selecting from among the plurality of the prepared items of detection offset information one item of detection offset information corresponding to the reflectivity of the detected alignment mark; and aligning the substrate based on:

i) the selected item of detection offset information; and ii) the position of the detected alignment mark.

17. The method according to claim 16 further comprising the step of projecting a pattern of a mask onto the substrate.

* * * * *